US008304983B2

(12) United States Patent
Son et al.

(10) Patent No.: US 8,304,983 B2
(45) Date of Patent: Nov. 6, 2012

(54) ITO FILM TREATED BY NITROGEN PLASMA AND THE ORGANIC LUMINESCENT DEVICE USING THE SAME

(75) Inventors: Se Hwan Son, Daejeon (KR); Min Soo Kang, Daejeon (KR); Sang Young Jeon, Seoul (KR); Jong Geol Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 12/588,692

(22) Filed: Oct. 23, 2009

(65) Prior Publication Data
US 2010/0044694 A1 Feb. 25, 2010

Related U.S. Application Data

(62) Division of application No. 10/555,056, filed as application No. PCT/KR2004/001181 on May 19, 2004, now Pat. No. 7,619,356.

(30) Foreign Application Priority Data

May 23, 2003 (KR) ........................ 10-2003-0032864

(51) Int. Cl.
*H01L 51/10* (2006.01)
*H01L 29/12* (2006.01)
*H01L 29/201* (2006.01)

(52) U.S. Cl. ............ 313/504; 257/40; 257/43; 257/615; 257/E29.09; 257/E51.018

(58) Field of Classification Search .......... 313/495–512; 445/24–25; 257/40, 43, 615, E29.09, E51.018
See application file for complete search history.

(56) References Cited

U.S. PATENT DOCUMENTS

| 5,059,863 A | 10/1991 | Tashiro et al. |
| 5,789,860 A | 8/1998 | Inoguchi et al. |
| 6,036,823 A | 3/2000 | Inoguchi et al. |

(Continued)

FOREIGN PATENT DOCUMENTS
EP 0817 537 A 1/1998
(Continued)

OTHER PUBLICATIONS

Wu, et al. "Surface Modification of Indium Tin Oxide by Plasma Treatment: An Effective Method to Improve the Efficiency, Brightness, and Reliability of Organic Light Emitting Devices"; Appl. Phys. Lett. 70(11), Mar. 17, 1997.

(Continued)

*Primary Examiner* — Anh Mai
*Assistant Examiner* — Elmito Breval
(74) *Attorney, Agent, or Firm* — McKenna Long & Aldridge LLP

(57) ABSTRACT

Disclosed are an Indium Tin Oxide (ITO) film, wherein nitrogen-containing compounds produced by reactions of nitrogen with at least one atom selected from the group consisting of In, Sn and O atoms which are constitutional elements of ITO, or deposited nitrogen-containing compounds are present on a surface of the ITO film; and a method for preparing an ITO film, comprising the step of treating a surface of the ITO film with nitrogen plasma. An organic electroluminescent device using the ITO film provided by the present invention as an anode shows a low voltage, a high efficiency and a long lifetime.

8 Claims, 3 Drawing Sheets

U.S. PATENT DOCUMENTS

| | | | |
|---|---|---|---|
| 6,259,202 | B1 | 7/2001 | Sturm et al. |
| 2001/0018238 | A1 | 8/2001 | Kim |
| 2002/0158242 | A1* | 10/2002 | Son et al. .................. 257/40 |
| 2003/0087119 | A1 | 5/2003 | Iwabuchi et al. |

FOREIGN PATENT DOCUMENTS

| | | |
|---|---|---|
| JP | 3037292 A | 2/1991 |
| JP | 4293767 A | 10/1992 |
| KR | 10-1999-004159 B1 | 9/1999 |
| KR | 10-2002-0088454 A | 11/2002 |
| TW | 385554 | 3/2000 |
| TW | 461124 | 10/2001 |
| WO | WO 02/088274 A | 11/2002 |

OTHER PUBLICATIONS

Fujita, et al. "*Surface Treatment of Indium-Tin Oxide Substrates and its Effects on Initial Nucleation Processes of Diamine Films*"; Jpn. J. App;. Phys. vol. 36 (1997) pp. 350-353 Part 1, No. 1A, Jan. 1997.

Kim, et al. "*Indium-Tin Oxide Treatments for Single-and Double-Layer Polymeric Light-Emitting Diodes: The Relation Between the Anode Physical, Chemical, and Morphological Properties and the Device Performance*"; Joun of App Phys. vol. 84, No. 12 Dec. 15, 1998.

Lee C-T et al: "Effects of plasma treatmehnt on the electrical and optical properties of indium tin oxide films fabricated by r.f. reactive sputtering"; Elsevier Science B.V., Thin Solid Films, 386, Dec. 31, 2001, pp. 105-110.

Yu H Y et al: "Surface electronic structure of plasma-treated indium tin oxides"; Applied Physics Letters, vol. 78, n. 17, Apr. 23, 2001, pp. 2595-2597.

Song W. So Sk, Cao: "Angular-dependent photoemission studies of indium tin oxide surfaces"; Applied Physics A, 72, Dec. 31, 2001, pp. 361-365.

Chan, I-Min et al. "Enhanced performance of organic light-emitting devices by atmospheric plasma treatment of indium tin oxide surfaces"; Applied Physics Letters, vol. 80, n. 1, Jan. 7, 2002, pp. 13-15.

Translation of Official Letter of Pending Patent Application under Examination dated Apr. 26, 2007 from the Taiwan Intellectual Property Office.

* cited by examiner

--Prior Art--

--Prior Art--

ITO FILM TREATED BY NITROGEN PLASMA AND THE ORGANIC LUMINESCENT DEVICE USING THE SAME

This application is a divisional application of application Ser. No. 10/555,056, filed Oct. 28, 2005, now U.S. Pat. No. 7,619,356 which claims the priority to PCT/KR2004/001181 filed May 19, 2004, which claims benefit to Korean Patent Application No. 10-2003-0032864, filed on May 23, 2003, all of which are hereby incorporated by reference for all purposes as if fully set forth herein.

TECHNICAL FIELD

Background Art

Recently, active research into an organic substance such as conjugated conducting polymer have been made, since an organic electroluminescent device using poly (p-phenylene vinylene) (PPV), which is a conjugated polymer, was developed. Also, research into applying such an organic substance to a thin film transistor, a sensor, a laser, a photoelectric device, etc., and particularly to an organic electroluminescent device, have been progressing continuously.

Generally, an organic electroluminescent device comprises a multi-layer structure in which thin films composed of different organic substances are disposed between two counter-electrodes so as to increase the efficiency and the stability of the device. As shown in FIG. 1, the most typical multi-layer structure of an organic electroluminescent device comprises a hole injection layer 3 to which holes are injected from an anode 2, a hole transporting layer 4 for transporting holes, an emitting layer 5 in which combinations of holes and electrons are accomplished, and a cathode 7. Such organic electroluminescent device may utilize the said layers composed of mixed materials or further comprise an additional layer for the purpose of improving the efficiency and the life of the device. Additionally, in order to simplify the manufacture of the device, a multi-functional material may be used to reduce the number of the layers contained in the device.

Meanwhile, one electrode on a substrate uses a transparent material having a low absorbance to visible light so as to emanate the light emitted from an organic electroluminescent device to outside, wherein Indium Tin Oxide (ITO) is generally used as a transparent electrode material and as an anode for injecting holes.

An organic electroluminescent device works according to the following mechanism. Holes and electrons generated respectively from an anode having a high work function and a cathode having a low work function are injected into an emitting layer through a hole injection layer/a hole transporting layer and an electron injection layer, thereby producing excitons in the emitting layer. Finally, when the excitons decay, lights corresponding to the energy concerned are emitted.

Researches into an organic electroluminescent device have been made mainly in regard to the efficiency, the life, the driving voltage and the color of light of the device. Particularly, charge injection on the interface between an organic electroluminescence substance and an electrode mostly affects the efficiency and the lifetime. Therefore, intensive researches for improving the interfacial properties have been made.

More particularly, ITO surface treatment methods for improving the interfacial properties between an ITO surface and a hole injection layer are known. Conventionally, ITO surface treatment methods include cleaning by ultrasonification and/or UV ozone, plasma treatments, or the like. Among them, oxygen plasma treatments improve the efficiency and the lifetime of, an organic electroluminescent device. See C. C. Wu et al., Applied Physics Letter, 70, 1348, 1997. It is reported that oxygen plasma-treatment on ITO surface makes the work function and sheet resistance of ITO increase and makes ITO surface more uniform. See S. Fujita et al., Japanese Journal of Applied Physics, 36, 350, 1997 and J. S. Kim et al., Journal of Applied Physics 84, 6859, 1995. Also, oxygen plasma treatments on ITO improve the hole injection by increasing a work function of ITO. Further, treatments with oxygen plasma can remove polluting materials present on the ITO surface, thereby improving the performance of an organic electroluminescent device.

Additionally, the interface between an inorganic oxide, i.e., ITO electrode and an organic hole injection layer has a relatively unstable structure compared to a general interface between organic substances. In order to solve this problem, as shown in FIG. 2, a hole tunnel layer (a hole tunneling (buffer) layer) may be inserted between ITO and a hole injection layer so as to improve the adhesion of the organic layer and the hole injection.

DISCLOSURE OF THE INVENTION

Figure 1:
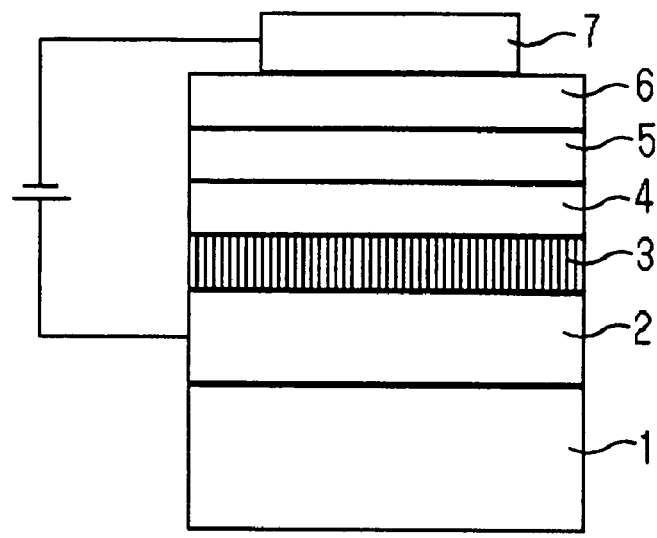
FIG. 1 is a sectional view of a conventional organic electroluminescent device having a structure comprising substrate/anode/hole injection layer/hole transporting layer/emitting layer/electron transporting layer/cathode.
Figure 2:
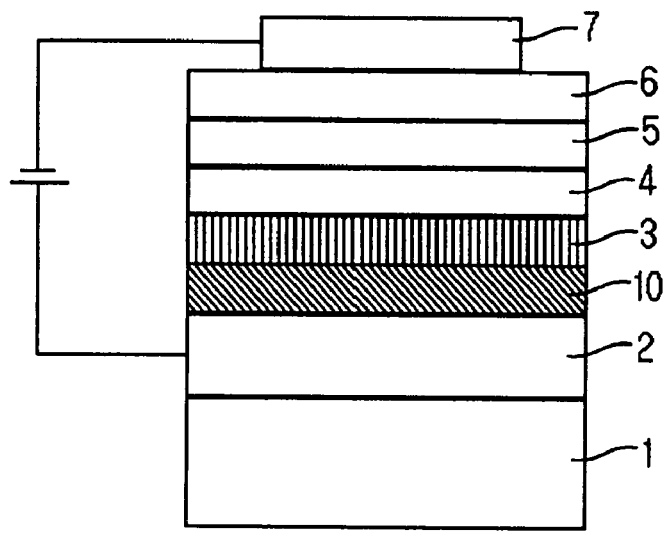
FIG. 2 is a sectional view of a conventional organic electroluminescent device having a structure comprising substrate/anode/hole tunneling layer(buffer layer)/hole injection layer/hole transporting layer/emitting layer/electron transporting layer/cathode, wherein drawing numeral 1 represents a substrate, 2 represents an anode, 3 represents a hole injection layer, 4 represents a hole transporting layer, 5 represents an emitting layer, 6 represents an electron transporting layer, 7 represents a cathode and 10 represents a hole tunneling layer (buffer layer).

We have found that when an ITO surface is treated with nitrogen plasma instead of oxygen plasma, a thin film of nitrogen-containing compounds is formed on the ITO surface, and, although the work function of the ITO surface decrease thereby, organic electroluminescent devices using the ITO anode having the thin film of nitrogen -containing compounds on ITO surface show improved photo-efficiency, driving voltage and lifetime compared to organic electroluminescent devices using an ITO anode treated with oxygen plasma. The present invention is based on this finding.

According to an aspect of the present invention, there is provided an ITO film, wherein nitrogen-containing compounds produced by reactions of nitrogen with at least one element selected from the constitutional elements of Indium Tin Oxide (ITO), i.e., In, Sn and O, or deposited nitrogen-containing compounds are present on the surface of ITO.

According to another aspect of the present invention, there is provided a method for preparing an ITO film comprising the step for treating the surface of the film comprising ITO with nitrogen plasma.

According to still another aspect of the present invention, there is provided an organic electroluminescent device comprising a substrate, an anode, an emitting layer and a cathode, wherein the anode comprises the ITO film according to the present invention.

The present invention will be explained in detail hereinafter.

ITO is a transparent conductive oxide and has advantages of a high transparency, a low sheet resistance and good patterning capability. By virtue of these advantages, ITO is applied not only to an organic electroluminescent device but also to an electrode material in various fields including a liquid crystal display (LCD), a solar cell, a plasma display and an e-paper. Additionally, it is applied in a technology for protection of electromagnetic waves from a cathode-ray tube monitor and in ITO ink.

Meanwhile, ITO as an anode for an organic electroluminescent device is characterized by the following.

ITO is an n-type indium oxide strongly doped with Sn. Indium oxide is a semiconductor in which 2 p orbital of an oxygen ion forms a valence band and 5 s orbital of In forms a conduction band. In general, as ITO is reduced to a certain degree, oxygen ions and doped Sn ions act as donors. Additionally, as the concentration of these ions increases, the Fermi level is located over the conduction band, and thus ITO represents metallic properties.

The following are known: generally, ITO has a higher Sn concentration on its surface than in the inside thereof; thus, the Fermi level increases and ITO has a low work function; when an ITO surface is treated with oxygen plasma, the surface having a high Sn concentration is etched and oxygen is supplied to the surface, thereby increasing the oxygen concentration on the surface; therefore, oxygen plasma treatments increase the work function, so that the barrier for the hole injection may decrease and the performance of an organic electroluminescent device may be improved.

However, when oxygen atoms are diffused and introduced into an organic layer in an organic electroluminescent device, for example, into a hole injection layer, the organic substance may be oxidized, and thus may lose the properties as a hole injection layer.

We recognized for the first time that ITO used as an anode for an organic electroluminescent device might cause the problem of oxygen diffusion into an organic layer, and that treatments of an ITO anode with oxygen plasma increase the oxygen concentration, and thus may cause the problem of oxygen diffusion into an organic layer. Therefore, in order to solve this problem, an ITO film according to the present invention is characterized in that it comprises a surface including nitrogen-containing compounds obtained by nitrogen plasma treatments.

When an ITO surface is treated with nitrogen plasma, some nitrogen molecules used as a plasma discharge gas may be ionized under the plasma condition, and react with In, Sn and O atoms present on the ITO surface to form a nitrogen-containing compound. Further, some nitrogen-containing compounds formed in the plasma may be deposited on the ITO surface.

As can be seen from XPS analysis for an ITO surface treated with nitrogen plasma, a nitrogen-containing compound, for example, InN is observed.

The nitrogen-containing compounds formed on the ITO surface can reduce the oxygen concentration on the ITO surface, and the thin film of nitrogen-containing compound can prevent oxygen atoms from diffusing into a hole injection layer starting from the ITO surface, thereby improving the hole injection and the interfacial adhesion like a hole tunneling (buffer) layer in an organic electroluminescent device. Therefore, the performance of an organic electroluminescent device can be improved due to the aforesaid function of the nitrogen-containing compounds on the ITO surface.

Additionally, nitrogen plasma reduces the Sn concentration by the surface etching, and thus the ITO interface of an organic electroluminescent device may be stabilized, and the lifetime and the efficiency of the device may be improved.

Nitrogen plasma used in the present invention may utilize nitrogen gas, or a mixed gas of nitrogen, oxygen, argon, hydrogen, etc., as a plasma discharge gas. Also, ammonia gas or a mixed gas including ammonia may be utilized as a plasma discharge gas, instead of nitrogen gas.

The oxygen concentration on the ITO surface can be controlled by using hydrogen, ammonia or oxygen in combination with nitrogen gas or ammonia gas as a plasma discharge gas. In the case of argon, surface-etching ratio is excellent. Therefore, a mixed gas containing these elements may be utilized so as to control the uniformity of the ITO surface and the oxygen concentration on the ITO surface.

When a reactive gas, more particularly, hydrogen gas having high reactivity to oxygen is mixed with nitrogen in an amount of less than 3%, or $NH_3$ gas is mixed with nitrogen gas, oxygen atoms present on the ITO surface may be reacted with hydrogen atoms, that is, be reduced to make the surface into an oxygen-deficiency state favorable to form nitrogen-containing compounds on the ITO surface.

Nitrogen plasma treatments are performed as the following, but are not limited thereto.

After ITO glass is introduced into an RF plasma reactor, vacuum is applied to a vacuum level of $1 \times 10^{-6}$ torr by using a turbo vacuum pump, and then using a 100 sccm nitrogen Mass Flow Controller (MFC), nitrogen gas flows into RF plasma reactor at 63 sccm to maintain a vacuum level of 14 mtorr for 10 minutes. An RF output is set by using an RF generator and an RF controller to generate nitrogen plasma. Variables for the condition of plasma treatments include a vacuum level, an RF power and a treating time. Also, a vacuum level can be controlled by using a nitrogen MFC, and an RF power and a treating time can be controlled by using an RF controller.

The range of nitrogen plasma power that may be used in the present invention is preferably from 30 W to 150 W. If the RF power decreases, a thin film of nitrogen-containing compound is hardly formed. On the other hand, if the RF power is more than 150 W, ITO surface etching increases, surface uniformity decreases, the thickness of nitrogen-containing compound layer increases, and thus hole tunneling becomes difficult.

As long as a layer formed by nitrogen plasma treatments prevents the diffusion of oxygen atoms, the concept of the present invention may be applied to a general metal oxide conductor for an anode in addition to ITO, and this is also included in the scope of the present invention. The metal oxide conductor includes, for example, Indium Zinc Oxide (IZO).

BEST MODE FOR CARRYING OUT THE INVENTION

Reference will now be made in detail to the preferred embodiments of the present invention. The following examples are illustrative only, and the scope of the present invention is not limited thereto.

EXAMPLE 1

Preparation of ITO Transparent Electrode (Anode)

A glass substrate (Corning 7059 glass) coated with a thin film of ITO to a thickness of 1000 Å was introduced into distilled water in which a dispersing agent is dissolved, and then was ultrasonificated. The dispersing agent used for ultrasonication was a product available from the Fisher Company, and distilled water filtered two times with a filter available from the Millipore Company was used. After ITO was washed for 30 minutes, it was repeatedly ultrasonificated with distilled water two times for 10 minutes. After the completion of cleaning with distilled water, ultrasonifications of the substrate using isopropyl alcohol, acetone and methanol successively as a solvent are performed and then the substrate was dried.

Then, the substrate was transferred to a plasma reactor, treated with nitrogen plasma under a pressure of 14 mtorr at 50 W for 5 minutes, and then transferred to a vacuum deposition device.

Formation of Hole Tunneling (Buffer) Layer

A compound represented by the following formula 1e was deposited on the ITO transparent electrode prepared as described above by thermal vacuum deposition to a thickness of 20 Å, thereby forming a hole tunneling (buffer) layer:

[Formula 1e]

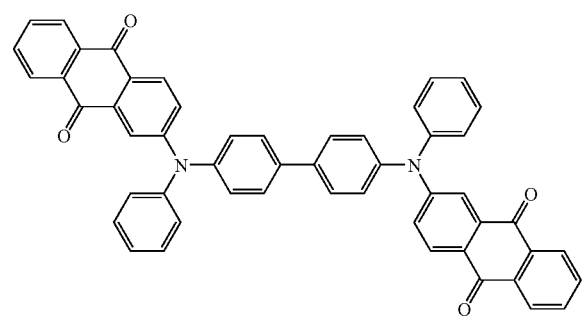

Formation of Hole Injection Layer

A compound represented by the following formula 1a, hexaazatriphenylenehexacarbonitrile, was deposited on the hole tunneling (buffer) layer by thermal vacuum deposition to a thickness of 500 Å to form a hole injection layer:

[Formula 1a]

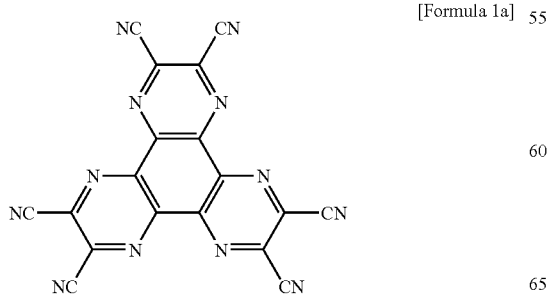

Formation of Hole Transporting Layer

A compound represented by the following formula 1c, NPB, was deposited on the hole injection layer by vacuum deposition to a thickness of 400 Å to form a hole transporting layer:

[Formula 1c]

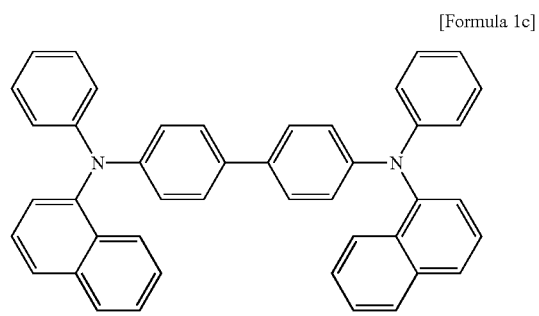

Formation of Emitting Layer

A compound represented by the following formula 1b, Alq3, was deposited on the hole transporting layer by vacuum deposition to a thickness of 300 Å to form an emitting layer:

[Formula 1b]

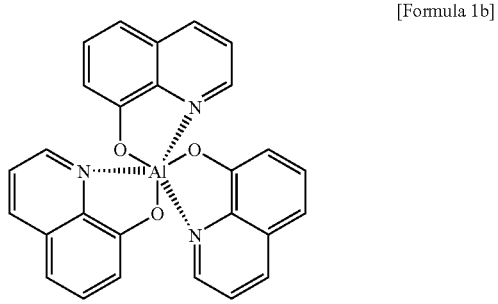

Formation of Electron Transporting Layer

A compound represented by the following formula 1d, a material for an electron transporting layer, was deposited on the emitting layer to a thickness of 200 Å to complete the formation of thin films of organic substances:

[Formula 1d]

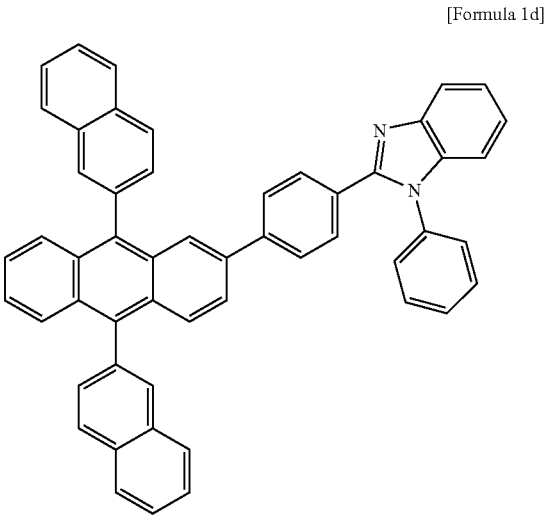

Formation of Cathode

Lithium fluoride (LiF) with a thickness of 12 Å and aluminum with a thickness of 2500 Å were deposited successively on the electron transporting layer to form a cathode, thereby providing an organic electroluminescent device.

In the above-mentioned process, the deposition rate of an organic substance is maintained at 0.4-0.7 Å/sec. The deposition rates of lithium fluoride and aluminum used in the cathode are maintained at 0.3 Å/sec and 2 Å/sec, respectively. The vacuum level is maintained at $2 \times 10^{-7}$ to $5 \times 10^{-7}$ torr during the vacuum deposition.

Comparative Examples 1, 2, 3 and 4

Example 1 was repeated to obtain an ITO anode and an organic electroluminescent device, except that nitrogen plasma treatment as described in Example 1 was not performed in Comparative Example 1, and that plasma using oxygen as a discharge gas, plasma using a mixed gas containing argon and oxygen in the ratio of 2:1 as a discharge gas, and plasma using argon as a discharge gas instead of nitrogen plasma, in Comparative Examples 2, 3 and 4, respectively.

EXPERIMENTAL EXAMPLE

The photo-efficiency, driving voltage and lifetime of each organic electroluminescent device obtained from Example 1 and Comparative Examples 2 to 4 were compared, and the results are shown in Table 1.

The photo-efficiency is defined by measuring the brightness per unit area ($cd/m^2$) of an organic electroluminescent device in the presence of an electric current with a current density of 100 mA/cm$^2$ at room temperature of 25° C., and dividing the obtained value by the current density, and is expressed in a cd/A unit.

The driving voltage represents a voltage (V) applied between both electrode terminals of an organic electroluminescent device, in the presence of an electric current with a current density of 10 mA/cm$^2$.

The lifetime represents a time at which point an organic electroluminescent device shows 50% of the initial brightness in the presence of an electric current with a current density of 100 mA/cm$^2$ at room temperature of 25° C.

TABLE 1

| | Photo-efficiency (cd/A) (100 mA/cm$^2$) | Driving voltage (V) (10 mA/cm$^2$). | Lifetime(½) (100 mA/cm$^2$) |
|---|---|---|---|
| Comp. Ex. 2 (O$_2$ Plasma) | 3.1 | 4.5 | 50 hours |
| Comp. Ex. 3 (Ar:O$_2$ Plasma) | 3.5 | 4.3 | 200 hours |
| Comp. Ex. 4 (Ar Plasma) | 2.9 | 3.7 | 335 hours |
| Example 1 (N$_2$ Plasma) | 3.9 | 3.9 | 500 hours or more |

As can be seen from Table 1, compared to Comparative Examples 2 and 3 using oxygen plasma and mixed argon-oxygen plasma, respectively, Example 1 using nitrogen plasma for treating the ITO surface shows the photo-efficiency increased by about 25% and 10%, the driving voltage decreased by about 15% and 10% and the lifetime increased by 1000% and 250%.

Accordingly, when an nitrogen plasma-treated ITO anode is used in an organic electroluminescent device, it is possible to provide an organic electroluminescent device having a higher photo-efficiency, a lower voltage and a longer lifetime compared to an organic electroluminescent device using an anode treated with oxygen plasma or argon-oxygen plasma.

Figure 3:
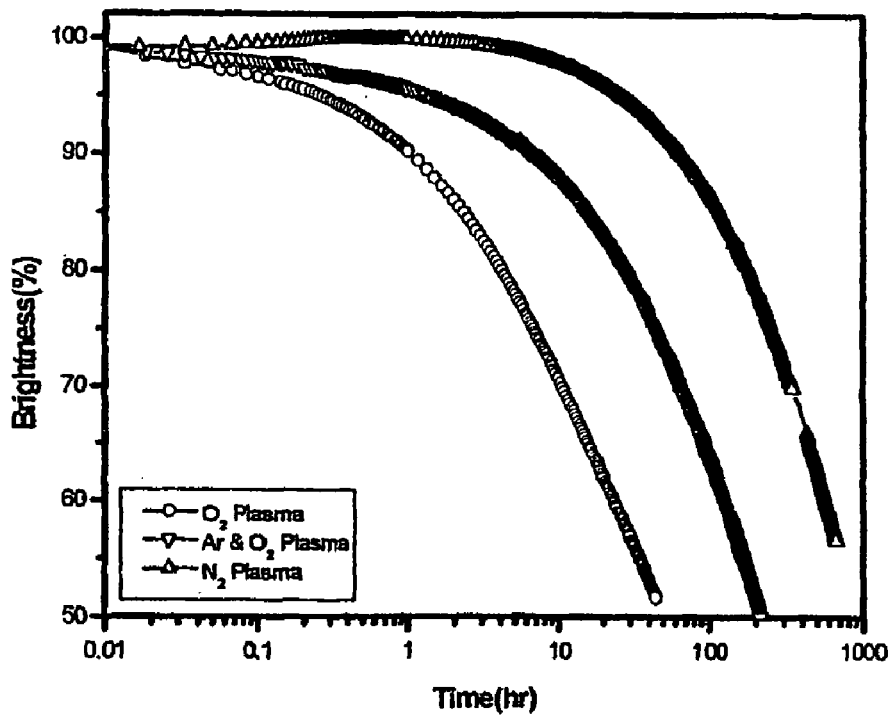
FIG. 3 is a graph showing the brightness intensity with time in an organic electroluminescent device according to a preferred embodiment of the present invention.
Figure 4:
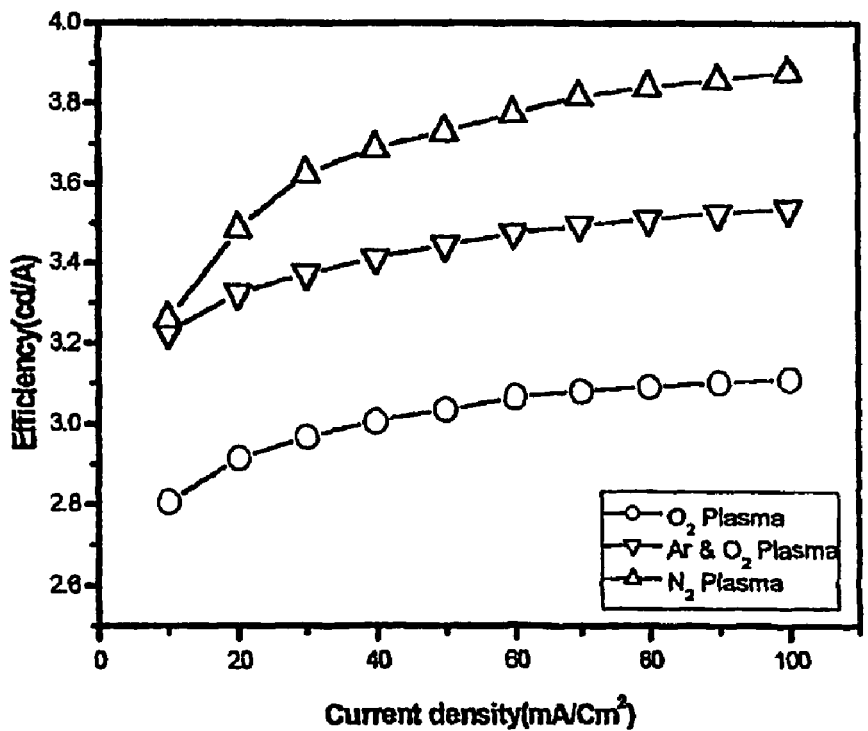
FIG. 4 is a graph showing the photo-efficiency with current density in an organic electroluminescent device according to a preferred embodiment of the present invention.

FIG. 3 is a graph showing the lifetime of an organic electroluminescent device when different types of plasma are used, and FIG. 4 is a graph showing the photo-efficiency with current density in an organic electroluminescent device when different types of plasma are used.

Figure 5:
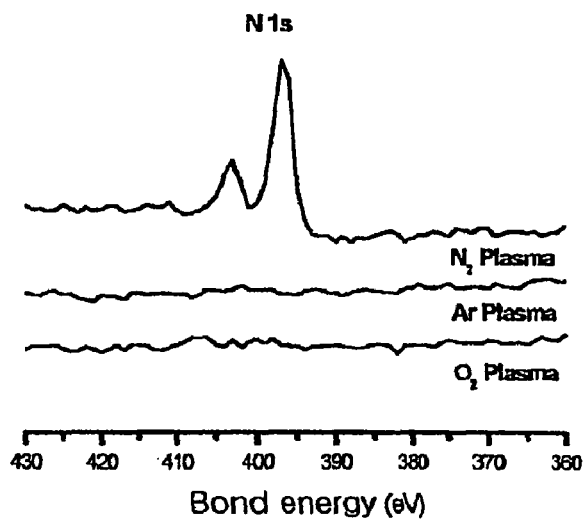
FIG. 5 is a graph obtained by XPS (X-ray Photoelectron Spectroscopy) of ITO surfaces treated with oxygen, argon-oxygen and nitrogen plasma.
Figure 6:
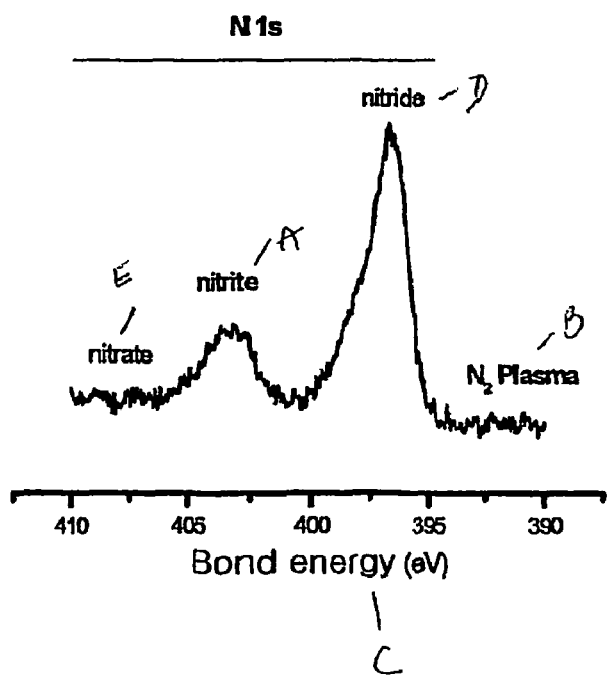
FIG. 6 is a detailed view of a graph obtained by XPS of an ITO surface treated with nitrogen plasma.

FIG. 5 is an XPS graph for ITO surfaces treated with oxygen plasma, argon-oxygen plasma and nitrogen plasma. FIG. 6 is a detailed view of a graph obtained by XPS of an ITO surface treated with nitrogen plasma. As shown in FIG. 6, two nitride peaks, which seem to correspond to InN, are observed at the range of bond energies from 397 eV to 400 eV, and a nitrite peak is observed at bond energy of 404 eV.

The work function and the atomic composition of the ITO in each ITO anode obtained from Example 1 and Comparative Examples 1 to 4 are shown in Table 2.

TABLE 2

| ITO treating condition | Work Function (eV) | Atomic composition (%) | | | |
|---|---|---|---|---|---|
| | | In | Sn | O | N |
| Comp. Ex. 1 Non-treated | 4.94 | 37.0 | 7.0 | 56.0 | |
| Comp. Ex. 2 O$_2$ Plasma | 5.85 | 39.9 | 3.0 | 57.1 | |
| Comp. Ex. 3 Ar & O$_2$ Plasma | 5.87 | 40.0 | 3.0 | 57.0 | |
| Comp. Ex. 4 Ar Plasma | 5.15 | 40.5 | 2.5 | 56.0 | |
| Example 1 N$_2$ Plasma | 4.89 | 35.8 | 2.4 | 48.7 | 13.3 |

As can be seen from FIG. 5, FIG. 6 and Table 2, about 13.3% of nitrogen atoms are observed from the surface treated with nitrogen plasma, which amount corresponds to about 27% of oxygen atoms.

As can be seen from Table 2, Comparative Examples 2 and 3 based on plasma using an oxygen-containing gas as a discharge gas show an increased work function. Furthermore, as demonstrated from the results of XPS analysis, ITO surfaces treated with oxygen plasma have a decreased Sn concentration and an increased oxygen concentration, thereby increasing the work function.

As shown in Table 2, even if the ITO surface in Example 1 using nitrogen plasma has a decreased oxygen concentration and a decreased work function, it shows an increased photo-efficiency, a decreased driving voltage and an increased lifetime, compared to Comparative Examples 2 and 3, as shown in Table 1.

Accordingly, from FIG. 5, FIG. 6 and Table 2, it is apparent that some nitrogen-containing molecules used as a plasma discharge gas are ionized under the plasma condition and reacted with In, Sn and O atoms present on the ITO surface to form a nitrogen-containing compound on the ITO surface, or are deposited on the ITO surface, and that such nitrogen-containing compounds or nitrogen atoms may contribute to improve the performances as described above.

Industrial Applicability

As can be seen from the foregoing, an organic electroluminescent device using an ITO anode surface-treated with nitrogen plasma according to the present invention stabilizes the interfacial properties of a hole injection layer or a hole tunneling (buffer) layer by nitrogen-containing compounds or nitrogen atoms formed on the surface of the anode, so that the lifetime and the efficiency of the device may be improved and the device may be driven at a low voltage.

While this invention has been described in connection with what is presently considered to be the most practical and preferred embodiment, it is to be understood that the invention is not limited to the disclosed embodiment and the drawings, but, on the contrary, it is intended to cover various modifications and variations within the spirit and scope of the appended claims.

The invention claimed is:

1. An Indium Tin Oxide (ITO) film for an anode of an organic electroluminescent device,
    wherein nitrogen-containing compounds produced by reactions of nitrogen with at least one atom selected from the group consisting of In, Sn and O atoms which are constitutional elements of ITO, or deposited nitrogen containing compounds are present on a surface of the ITO film; and the nitrogen-containing compounds on the surface are formed by treating the ITO film with nitrogen plasma, and
    wherein the surface of the ITO film has a lower work function than before the nitrogen plasma treatment.

2. The ITO film according to claim 1, wherein the discharge gas used for the nitrogen plasma comprises at least one gas selected from the group consisting of ammonia, a mixed gas of nitrogen and ammonia, and a mixed gas of nitrogen and hydrogen.

3. A method for preparing an Indium Tin Oxide (ITO) film for an anode of an organic electroluminescent device, comprising the step of treating a surface of the ITO film with nitrogen plasma such that the work function of the ITO surface decreases compared to the work function of the ITO surface before the nitrogen plasma treatment.

4. An organic electroluminescent device comprising a substrate, an anode, an emitting layer and a cathode,
    wherein the anode comprises an Indium Tin Oxide (ITO) film, and wherein nitrogen-containing compounds produced by reactions of nitrogen with at least one atom selected from the group consisting of In, Sn and O atoms which are constitutional elements of ITO, or deposited nitrogen containing compounds are present on a surface of the ITO film;
    wherein the nitrogen-containing compounds on the surface are formed by treating the ITO film with nitrogen plasma, and
    wherein the surface of the ITO film has a lower work function than before the nitrogen plasma treatment.

5. The organic electroluminescent device according to claim 4, wherein the discharge gas for the nitrogen plasma comprises at least one gas selected from the group consisting of ammonia, a mixed gas of nitrogen and ammonia, and a mixed gas of nitrogen and hydrogen.

6. An organic electroluminescent device comprising a substrate, an anode, an emitting layer and a cathode, wherein the anode comprises the ITO film obtained by the method defined in claim 3.

7. A metal oxide conductor for an anode of an organic electroluminescent device,
    wherein the metal oxide is treated with nitrogen plasma, and
    wherein the surface of the metal oxide conductor has a lower work function than before the nitrogen plasma treatment.

8. The ITO film according to claim 1, wherein the ITO film is used for an anode of an organic electroluminescent device that includes a hole injection layer comprising hexaazatriphenylenehexacarbonitrile.

* * * * *